United States Patent [19]
Gupta et al.

[11] Patent Number: 5,423,918
[45] Date of Patent: Jun. 13, 1995

[54] METHOD FOR REDUCING PARTICULATE CONTAMINATION DURING PLASMA PROCESSING OF SEMICONDUCTOR DEVICES

[75] Inventors: Anand Gupta, San Jose; Charles S. Rhoades, Los Gatos; Yan Ye, Campbell; Joseph Lanucha, Sunnyvale, all of Calif.

[73] Assignee: Applied Materials, Inc., Santa Clara, Calif.

[21] Appl. No.: 124,900

[22] Filed: Sep. 21, 1993

[51] Int. Cl.$^6$ ............................................. B08B 6/00
[52] U.S. Cl. ...................................... 134/1; 134/21; 134/37
[58] Field of Search ............... 134/1, 2, 19, 21, 22.18, 134/30, 37; 437/946

[56] References Cited

U.S. PATENT DOCUMENTS 5,238,532 8/1993 Zarowin et al. ..................... 134/1
5,252,181 10/1993 Dutartre et al. ..................... 437/946

Primary Examiner—Scott Kastler
Assistant Examiner—Sean Vincent
Attorney, Agent, or Firm—Noel F. Heal; Peter J. Sgarbossa

[57] ABSTRACT

A technique for removing particles from above a semiconductor wafer, particularly particles that are trapped in a plasma chamber during processing of the wafer. Trapped particles are usually not all drawn out with gases exhausted from the chamber, in part because a peripheral focus ring and clamping mechanism impede their flow. In the method of the invention, the focus ring and clamping mechanism are raised on completion of processing, but before radio-frequency (rf) power is disconnected from the process chamber. Trapped particles are then easily flowed from the chamber with an introduced inert gas, and the level of particulate contamination of the wafer is significantly reduced.

12 Claims, 1 Drawing Sheet

METHOD FOR REDUCING PARTICULATE CONTAMINATION DURING PLASMA PROCESSING OF SEMICONDUCTOR DEVICES

BACKGROUND OF THE INVENTION

This invention relates generally to techniques for removal of particulate contaminants during semiconductor processing and, more particularly, to methods for removing contaminant particles that may accumulate in a plasma reactor chamber.

In the manufacture of microelectronic devices, particulate contamination has become of increasing concern because semiconductor devices are being packed with ever-increasing densities on semiconductor chips. Usually, multiple chips are formed from a single larger semiconductor wafer, six to eight inches (15–20 cm) in diameter, but overall chip dimensions have been increasing in recent years and some integrated circuits may occupy areas comparable with a whole wafer. Concurrently, there has been a continuing trend toward smaller device geometries, i.e. higher device densities. Obviously, use of a smaller device geometry means that smaller contaminant particles may cause defects in a circuit. The presence of particles during deposition or etching of thin films can cause voids, dislocations or short-circuits, which adversely affect performance and reliability of the devices. Moreover, larger overall device dimensions result in a lower percentage yield of satisfactory devices.

Particle contamination has been significantly reduced by improving the quality of clean rooms and automated equipment designed to handle semiconductor wafers, and by improving techniques to clean the wafer surfaces. However, many particles are generated inside wafer processing chambers themselves. Possible sources of contamination include processing materials, interior walls of processing chambers, and mechanical wear of the automated wafer handling equipment. More specifically, in processing steps that use a plasma many chemical "fragments" of various kinds are generated from the processing gases, including ions, electrons and radicals. The fragments can combine to form generally slightly negatively charged particles, which may ultimately contaminate a wafer being processed. In addition, various materials, such as polymers, are coated onto the process chamber walls during plasma processing. Mechanical and thermal stresses may cause these materials to fracture and dislodge from the walls, generating additional contaminant particles. Other sources of contaminants are oil from vacuum pumps, and particles generated within the processing chambers during wafer transfer operations.

In plasma processing, contaminant particles typically become trapped in the chamber, between a plasma sheath adjacent to the wafer and a plasma glow region. The particles pose a significant risk of wafer contamination, especially at the end of plasma processing, when radio-frequency (rf) power that sustains the plasma is switched off. For many plasma processes, a focus ring is disposed above and at the circumference of the wafer, to enhance uniformity of processing by controlling the flow of active plasma species to the wafer, such as during a plasma etch process. The focus ring, and an associated wafer clamping mechanism, effectively preclude removal of the trapped particles by gas flow, unless the pressure in the chamber is reduced to an unacceptably low level. It will be appreciated that there is still a need to provide a reliable and inexpensive process to remove such particles from the wafer processing chamber. The present invention fulfills this need.

SUMMARY OF THE INVENTION

The present invention resides in a method for removing trapped particles from a semiconductor processing chamber in which a wafer is held in position by a peripheral mechanism, without reducing the chamber pressure and without the need for modification of the chamber structure. Briefly, and in general terms, the method of the invention comprises the steps of continuously evacuating the chamber; terminating a flow of cooling gas to the wafer; raising the peripheral mechanism above the wafer; introducing an inert gas into the chamber; and continuing to evacuate the chamber, wherein particles above the wafer can flow freely beneath the peripheral mechanism and out of the chamber. Optionally, the method also includes switching the supply of gas to an inert gas.

More specifically, as applied to a plasma-enhanced process, the method of the invention comprises the steps of placing a semiconductor wafer on a support in the processing chamber; lowering a clamping mechanism onto the wafer, the clamping mechanism including a focus ring extending above the wafer at its periphery, to enhance uniformity of processing; introducing process gases into the chamber; applying radio-frequency (rf) power to chamber electrodes, to sustain a plasma region that enhances processing of the wafer; and continuously evacuating the chamber through an exhaust port, to maintain a desired pressure in the chamber during processing. Then, on completion of processing but before disconnecting rf power from the chamber electrodes, the method of the invention performs the steps of terminating flow of any cooling gas supplied to the wafer, and raising the clamping mechanism and focus ring from the wafer, wherein particles trapped above the wafer during processing may flow out beneath the clamping mechanism and focus ring, and through the exhaust port. Preferably, the gas supply is switched to an inert gas prior to lifting the clamping mechanism, and the gas flow rate is increased and maintained for a period of at least a few seconds to ensure that particles are swept out into the exhaust port.

It will be appreciated from the foregoing that the present invention represents a significant advance in the field of plasma processing of semiconductor wafers. In particular, the invention substantially reduces the level of particulate contamination due to accumulation of trapped particles during processing. Other aspects and advantages of the invention will become apparent from the following more detailed description, taken in conjunction with the accompanying drawings.

DESCRIPTION OF THE PREFERRED EMBODIMENT

Figure 1:
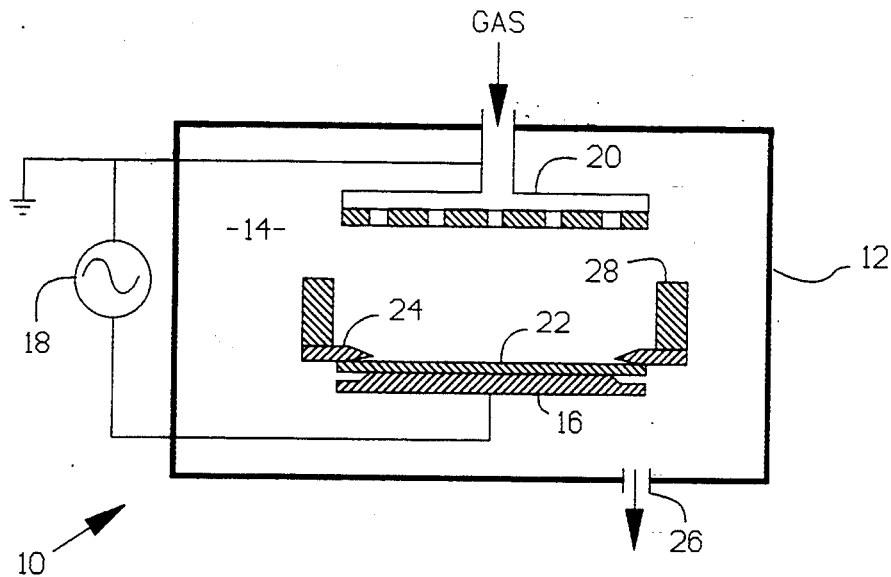
FIG. 1 is a schematic view, partly in section, of a plasma processing chamber of the type in which the method of the present invention is employed.
Figure 2:
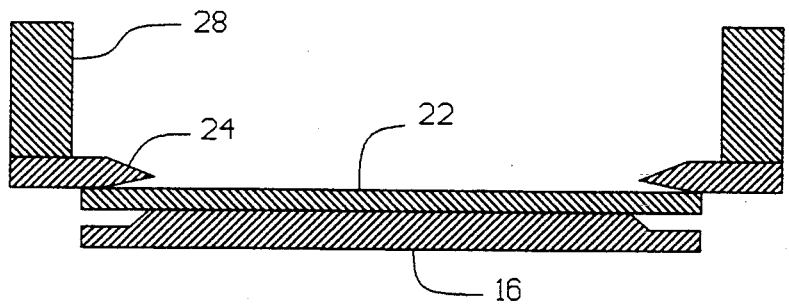
FIG. 2 is an enlarged schematic view of a portion of FIG. 1, showing a focus ring and clamping ring in relation to a wafer being processed.

As shown in the drawings for purposes of illustration, the present invention is concerned with a technique for removing contaminant particles from a plasma processing chamber. FIG. 1 depicts a plasma etch reactor, indicated by reference numeral 10 in the drawings, comprising a housing 12, typically made of a non-magnetic material such as aluminum, which defines a plasma processing chamber 14. A cathode 16 is connected to a source 18 of radio-frequency (rf) energy, and processing gases are supplied to the chamber 14 through a gas manifold 20 positioned above the cathode. A semiconductor wafer 22 to be processed is positioned on the cathode 16, which also functions as a wafer support structure. The wafer 22 is held against the cathode 16 by means of a clamping ring 24. During plasma processing, the wafer 22 heats up and must usually be cooled by some means. In a typical configuration, a cooling gas is supplied to the underside of the wafer 22, and the clamp serves to hold the wafer down against the pressure developed by the flow of cooling gas. An exhaust line 26, connected to a vacuum pump (not shown) continually evacuates the chamber 14.

In operation, the gas supply is initiated and the rf power is turned on, and a plasma forms in the space between the gas manifold 20 and the wafer 22. Cooling gas is supplied to the underside of the wafer 22. An active species of fragments in the plasma interacts with the wafer 22 and performs a desired process, such as etching. A focus ring 28 around the circumference of the wafer 22 extends upwardly above the wafer and enhances uniformity of the etch process. Unfortunately, during the process unwanted charged contaminant particles become trapped in the chamber 14 between a plasma sheath adjacent to the wafer 22 and the active or glow region of the plasma. The focus ring 28 and the clamping ring 24 generally prevent these particles from being flowed out of the chamber and through the exhaust line 26. Consequently, at the conclusion of processing, when the rf power is shut off, the contaminant particles may become lodged on the surface of the wafer 22.

Figure 3:
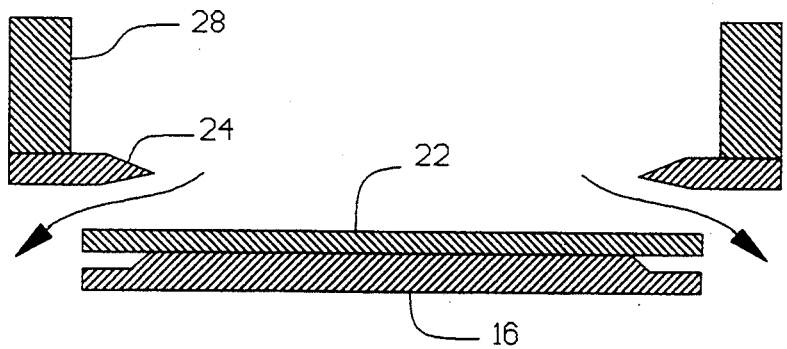
FIG. 3 is a schematic view similar to FIG. 2, but showing the focus ring and clamping ring raised in accordance with the present invention.

In accordance with the invention, at the conclusion of processing, but before switching off the rf power, the flow of cooling gas is terminated and the focus ring 28 and the clamping ring 24 are raised above the wafer 22 by a selected distance, such as approximately one-quarter of an inch (6 mm), as shown in FIG. 3, and an inert gas is introduced into the gas manifold 20. In the raised position, the focus ring 28 and clamping ring 24 present no impediment to the flow of trapped contaminant particles from above the wafer 22. The particles flow beneath the clamping ring 24 and out through the exhaust line 26, as indicated by the arrows in FIG. 3. Although the invention has been described as a method for removing trapped particles following plasma etch processing, it will be appreciated that the same procedure could be employed to clean the wafer and ensure that all particles are evacuated from the chamber prior to processing.

No additional mechanism is needed to raise the focus ring 28 and clamping ring 24, since the mechanism is already needed to release the wafer 22 after processing. Only the time of operation of the mechanism is changed in accordance with the invention, to produce a significant improvement in reduction of particulate contamination. Preferably, the sequence of steps followed in operating a plasma etch reactor in accordance with the invention are: (1) turning off the flow of cooling gas to the underside of the wafer 22; (2) raising the focus ring 28 and clamping ring 24; (3) switching the flow of gas, optionally, to an inert gas, such as argon; (4) increasing the flow rate for a short period, such as a few seconds; and (5) switching off the supply of rf power to the reactor.

It will be appreciated from the foregoing that the present invention represents a significant advance in the field of semiconductor processing, and particularly in plasma processing. The method of the invention provides a simple but effective means for removing contaminant particles trapped in a plasma processing chamber, without having to modify the structure of the chamber, and without the complexity associated with controlling the pressure within the chamber to achieve particle removal. It will also be appreciated that, although a specific embodiment of the invention has been described in detail for purposes of illustration, various modifications may be made without departing from the spirit and scope of the invention. Accordingly, the invention should not be limited except as by the appended claims.

We claim:

1. A method for removing unwanted contaminant particles from a processing chamber, in which a semiconductor wafer is held in position on an electrode and a peripheral mechanism extends above the wafer from its periphery, thereby impeding removal of contaminant particles from the chamber, the method comprising the steps of:

continuously evacuating the chamber;
   terminating a flow of cooling gas to the wafer;
   raising the peripheral mechanism above the wafer;
   supplying gas to the chamber; and
   continuing to evacuate the chamber, wherein particles above the wafer can flow freely beneath the peripheral mechanism and out of the chamber.

2. A method as defined in claim 1, wherein the step of supplying gas to the chamber includes switching to a source of inert gas prior to raising the peripheral mechanism.

3. A method for removing unwanted contaminant particles from a plasma processing chamber, the method comprising the steps of:

placing a semiconductor wafer on a support in the processing chamber;
   lowering a clamping mechanism onto the wafer, the clamping mechanism including a focus ring extending above the wafer at its periphery, to enhance uniformity of processing;
   introducing process gases into the chamber;
   applying radio-frequency (rf) power to chamber electrodes, to sustain a plasma region that enhances processing of the wafer;
   continuously evacuating the chamber through an exhaust port, to maintain a desired pressure in the chamber during processing; and
   on completion of processing, but before disconnecting rf power from the chamber electrodes, terminating flow of any cooling gas supplied to the wafer and raising the clamping mechanism and focus ring from the wafer, wherein particles trapped above the wafer during processing may flow out beneath the clamping mechanism and focus ring, and through the exhaust port.

4. A method as defined in claim 3, and further comprising the step switching from a supply of process gases to a supply of inert gas prior to lifting the clamping mechanism.

5. A method as defined in claim 4, and further comprising the step of increasing the flow rate of inert gas after switching to the inert gas supply.

6. A method as defined in claim 5, and further comprising the step of maintaining the increased flow rate for a period of at least a few seconds, to sweep the particles into the exhaust port.

7. A method as defined in claim 3, and further comprising the step switching from a supply of process gases to a supply of inert gas after lifting the clamping mechanism.

8. A method as defined in claim 7, and further comprising the step of increasing the flow rate of inert gas after switching to the inert gas supply.

9. A method as defined in claim 8, and further comprising the step of maintaining the increased flow rate for a period of at least a few seconds, to sweep the particles into the exhaust port.

10. A method for removing unwanted contaminant particles from a processing chamber, in which a semiconductor wafer is held in position on an electrode and a peripheral mechanism extends around and in close proximity to the wafer in such a manner as to impede removal of contaminant particles by gas flow through the chamber, the method comprising the steps of:

continuously evacuating the chamber;

moving the peripheral mechanism away from the wafer;

supplying gas to the chamber; and continuing to evacuate the chamber, wherein particles near the wafer can flow freely between the peripheral mechanism and the wafer and thence out of the chamber.

11. A method as defined in claim 10, wherein:

the peripheral mechanism includes a focus ring and the method includes the step of applying radio-frequency (rf) power to chamber electrodes to form a plasma in the chamber, and continuing to apply rf power for a selected time after moving the peripheral mechanism away from the wafer.

12. A method as defined in claim 10, wherein:

the peripheral mechanism includes a clamping ring for securing the wafer against the electrode and the method includes the step of applying radio-frequency (rf) power to chamber electrodes to form a plasma in the chamber, and continuing to apply rf power for a selected time after moving the peripheral mechanism away from the wafer.

* * * * *